(12) United States Patent
Park et al.

(10) Patent No.: US 10,719,266 B2
(45) Date of Patent: Jul. 21, 2020

(54) CONTROLLER TO PERFORM PRE-PUMPING OPERATION AND OPERATING METHOD THEREOF

(71) Applicant: SK hynix Inc., Gyeonggi-do (KR)

(72) Inventors: Byeong-Gyu Park, Gyeonggi-do (KR); Hyunjun Kim, Gyeonggi-do (KR); Byoung-Sung You, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 130 days.

(21) Appl. No.: 15/893,858

(22) Filed: Feb. 12, 2018

(65) Prior Publication Data
US 2019/0018612 A1  Jan. 17, 2019

(30) Foreign Application Priority Data
Jul. 13, 2017 (KR) .................. 10-2017-0088938

(51) Int. Cl.
*G06F 11/10* (2006.01)
*G06F 12/06* (2006.01)
*G06F 13/42* (2006.01)
*G06F 3/06* (2006.01)
(Continued)

(52) U.S. Cl.
CPC ............ *G06F 3/0659* (2013.01); *G06F 3/061* (2013.01); *G06F 3/0679* (2013.01); *G06F 11/1048* (2013.01); *G06F 11/1068* (2013.01); *G11C 29/52* (2013.01); *G11C 2029/0409* (2013.01); *G11C 2029/0411* (2013.01)

(58) Field of Classification Search
CPC .. G06F 3/0659; G06F 11/1048; G06F 3/0679; G06F 11/1068; G06F 3/061; G11C 29/52; G11C 2029/0409; G11C 2029/0411
See application file for complete search history.

(56) References Cited

U.S. PATENT DOCUMENTS 9,171,622 B2* 10/2015 Kwon ................ G11C 16/3477
9,269,413 B2*  2/2016 Cho .................... G11C 11/4085
9,484,081 B2* 11/2016 Cho .................... G11C 11/4085
(Continued)

FOREIGN PATENT DOCUMENTS

KR          100535652       12/2005

OTHER PUBLICATIONS

Jeff Tyson, "How Ram Works", Aug. 1, 2003, pp. 1-3, https://web.archive.org/web/20030801083340/https://computer.howstuffworks.com/ram1.htm (Year: 2003).*

(Continued)

*Primary Examiner* — Christopher D Birkhimer
(74) *Attorney, Agent, or Firm* — IP & T Group LLP

(57) ABSTRACT

A controller includes: a processor suitable for controlling a memory device to read map data stored in a memory and read out a physical address corresponding to data requested by a host to be read; a counter suitable for obtaining reliability information on the map data stored in the memory; a determining unit suitable for activating a pre-pumping mode when reliability of the map data is poor; a deciding unit suitable for determining a first target die of a pre-pumping operation for reading the data in the activated pre-pumping mode; and a pumping unit suitable for controlling the memory device to perform the pre-pumping operation on the first target die during a background operation for reading out the physical address.

19 Claims, 10 Drawing Sheets

(51) Int. Cl.
   *G11C 29/04*   (2006.01)
   *G11C 29/52*   (2006.01)

(56) References Cited

U.S. PATENT DOCUMENTS

| | | | |
|---|---|---|---|
| 9,530,471 B1* | 12/2016 | Shin | G11C 8/10 |
| 9,564,189 B2* | 2/2017 | Han | G11C 29/1201 |
| 9,595,309 B2* | 3/2017 | Kim | G11C 8/12 |
| 9,727,401 B2* | 8/2017 | Han | G06F 11/076 |
| 2004/0111554 A1 | 6/2004 | Chevallier et al. | |
| 2016/0086653 A1* | 3/2016 | Cho | G11C 11/4085 |
| | | | 365/189.09 |

OTHER PUBLICATIONS

Anonymous, "Dynamic Random Access Memories (DRAMs)", Apr. 25, 2016, pp. 1-2, https://web.archive.org/web/20160425213426/ https://www.eesemi.com/drams.htm (Year: 2016).*

* cited by examiner

CONTROLLER TO PERFORM PRE-PUMPING OPERATION AND OPERATING METHOD THEREOF

CROSS-REFERENCE TO RELATED APPLICATIONS

The present application claims priority under 35 U.S.C. § 119(a) to Korean Patent Application No. 10-2017-0088938, filed on Jul. 13, 2017, the disclosure of which is incorporated herein by reference in its entirety.

BACKGROUND

1. Field

Various exemplary embodiments of the present invention generally relate to an electronic device. Particularly, the embodiments relate to a controller capable of controlling a memory device and an operating method thereof.

2. Description of the Related Art

The computer environment paradigm has changed to ubiquitous computing systems that can be used anytime and anywhere. That is, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a controller capable of improving read performance of a memory system and an operating method thereof.

In accordance with an embodiment of the present invention, a controller may include a processor suitable for controlling a memory device to read map data stored in a memory and read out a physical address corresponding to data requested by a host to be read; a counter suitable for obtaining reliability information on the map data stored in the memory; a determining unit suitable for activating a pre-pumping mode when reliability of the map data is poor; a deciding unit suitable for determining a first target die of a pre-pumping operation for reading the data in the activated pre-pumping mode; and a pumping unit suitable for controlling the memory device to perform the pre-pumping operation on the first target die during a background operation for reading out the physical address.

The determining unit deactivates the pre-pumping mode when the reliability of the map data is good, wherein the deciding unit further decides a second target die of a pump-on operation for reading the data in the deactivated pre-pumping mode, and the pumping unit controls the memory device to perform the pump-on operation on the second target die after the background operation for reading out the physical address is completed.

The memory device may perform the background operation of reading out the physical address through the map data.

The reliability information on the map data includes a ratio of a number of map misses to a number of map lookups, and the reliability of the map data is determined as poor when the ratio of the number of map misses to the number of map lookups is greater than a threshold value.

The reliability information on the map data may include a ratio of a number of map misses to a number of map lookups, and the reliability of the map data is determined as good when the ratio of the number of map misses to the number of map lookups is equal to or smaller than a threshold value.

The processor may control the memory device to read the data corresponding to the physical address after the background operation for reading out the physical address is completed.

The processor may be further suitable for controlling the memory device to read the data corresponding to the physical address after the physical address is read out and the pump-on operation is performed.

The deciding unit may determine at least one idle die as the first target die among all idle dies.

The idle die may be one of a die most recently selected for a read operation, a die logically subsequent to the die most recently selected for a read operation, a die in the same channel as most recently selected for a read operation, a die in a channel logically subsequent to the channel most recently selected for a read operation, a die in the same way as most recently selected for a read operation, a die in a way logically subsequent to the way most recently selected for a read operation, and a die previously selected for a read operation a great number of times The deciding unit decides a die corresponding to the read-out physical address as the second target die.

In accordance with an embodiment of the present invention, an operating method of a controller may include: controlling a memory device to read map data stored in a memory and read out a physical address corresponding to data requested by a host to be read; evaluating reliability based on reliability information on the map data stored in the memory; activating a pre-pumping mode when the reliability of the map data is poor; deciding a first target die of a pre-pumping operation for reading the data in the activated pre-pumping mode; and controlling the memory device to perform the pre-pumping operation on the first target die during a background operation for reading out the physical address.

The pre-pumping mode is deactivated when the reliability of the map data is good, and an operating method of the controller may further include deciding a second target die of a pump-on operation for reading the data is decided in the deactivated pre-pumping mode; and controlling the memory device to perform the pump-on operation on the second target die after the background operation for reading out the physical address is completed.

The background operation of reading out the physical address may be performed through the map data.

The reliability information on the map data may include a ratio of a number of map misses to a number of map lookups, and the reliability of the map data may be determined as poor when the ratio of the number of map misses to the number of map lookups is greater than a threshold value.

The reliability information on the map data may include a ratio of a number of map misses to a number of map lookups, and the reliability of the map data may be determined as good when the ratio of the number of map misses to the number of map lookups is equal to or smaller than a threshold value.

The operating method may further include: controlling the memory device to read data corresponding to the physical address after the physical address is read out.

The operating method may further include: controlling the memory device to read data corresponding to the physical address after the physical address is read out and the pump-on operation is performed.

The deciding of the first target die may include determining at least one idle die as the first target die among all idle dies.

The idle die may be one of a die most recently selected for a read operation, a die logically subsequent to the die most recently selected for a read operation, a die in the same channel as most recently selected for a read operation, a die in a channel logically subsequent to the channel most recently selected for a read operation, a die in the same way as most recently selected for a read operation, a die in a way logically subsequent to the way most recently selected for a read operation and a die previously selected for a read operation a great number of times.

The deciding of the second target may include determining a die corresponding to the read-out physical address as the second target die.

In accordance with an embodiment of the present invention, a memory system may include: a memory device; and a controller suitable for controlling the memory device to read requested data based on map data, and suitable for controlling, when a reliability of the map data is below a threshold, the memory device to perform a pre-pump operation for reading the requested data while reading the map data.

DETAILED DESCRIPTION

Figure 1:
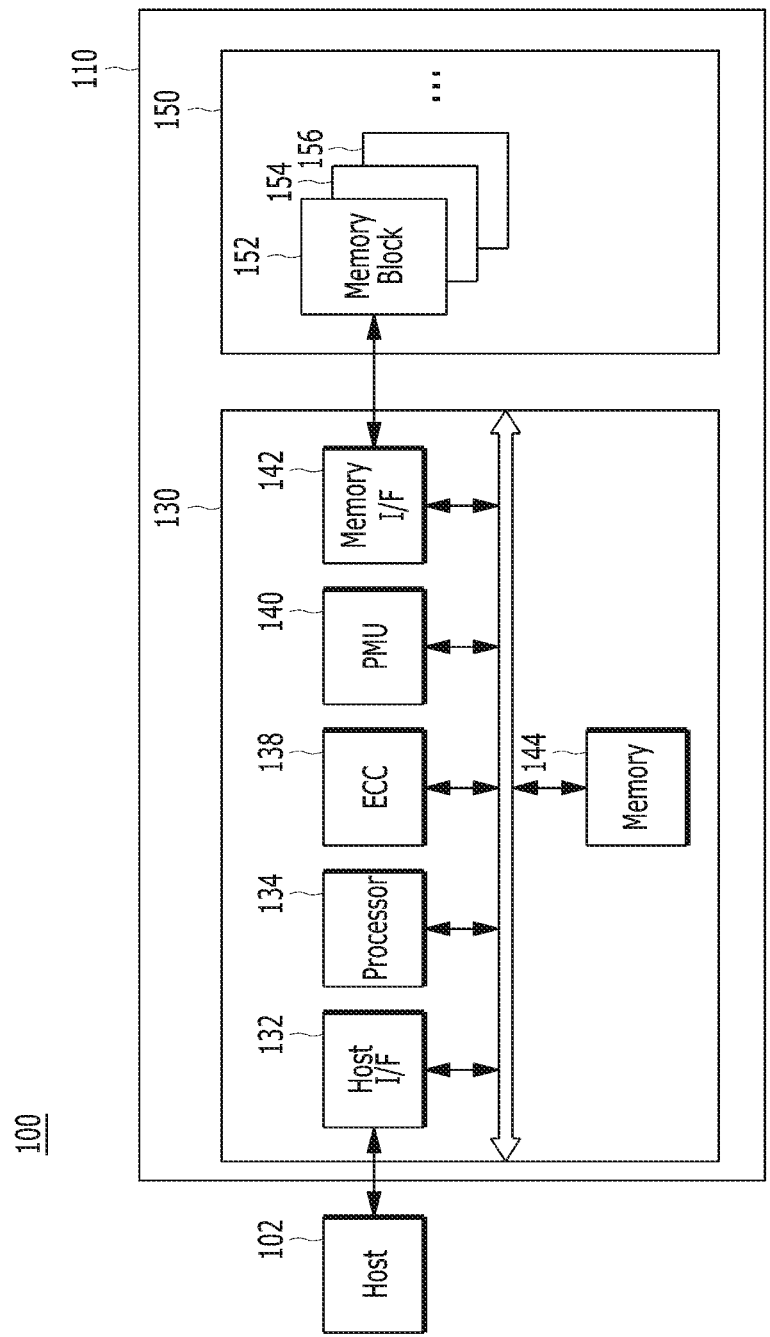
FIG. 1 is a block diagram illustrating a data processing system including a memory system, in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player, and a laptop computer or an electronic device such as a desktop computer, a game player, a TV, a projector, and the like.

The memory system 110 may operate in response to a request from the host 102, and in particular, store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the pages may include a plurality of memory cells to which a plurality of word lines WL are electrically coupled.

The controller 130 may control overall operations of the memory device 150, such as read, write, program, and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory interface I/F unit 142 such as a NAND flash controller (NFC), and a memory 144 all operatively coupled via an internal bus.

The host interface unit 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDDC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems, or devices for the error correction operation.

The PMU 140 may provide and manage power of the controller 130.

The memory interface unit 142 may serve as a memory/storage interface between the controller 130 and the memory device 150 to allow the controller 130 to control the memory device 150 in response to a request from the host 102. The memory interface unit 142 may generate a control signal for the memory device 150 and process data to be provided to the memory device 150 under the control of the processor 134 when the memory device 150 is a flash memory and, in particular, when the memory device 150 is a NAND flash memory. It is noted that the present invention is not limited to NAND flash memory/NAND flash interface, and that a suitable memory/storage interface may be selected depending upon the type of the memory device 150.

The memory 144 may serve as a working memory of the memory system 110 and the controller 130, and store data for driving the memory system 110 and the controller 130.

The controller 130 may control the memory device 150 in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). Although FIG. 1 shows the memory 144 inside controller 130, it is for illustrative purposes only, and the present disclosure is not limited thereto. That is, the memory 144 may be disposed within or out of the controller 130. In another embodiment, the memory 144 may be embodied by an external volatile memory having a memory interface transferring data between the memory 144 and the controller 130.

The processor 134 may control the overall operations of the memory system 110. The processor 134 may drive firmware, which is referred to as a flash translation layer (FTL), to control the general operations of the memory system 110.

The FTL may perform an operation as an interface between the host 102 and the memory device 150. The host 102 may request to the memory device 150 write and read operations through the FTL.

The FTL may manage operations of address mapping, garbage collection, wear-leveling, and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data into another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory such as a NAND flash memory, a program failure may occur during the write operation (i.e., during the program operation), due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is needed.

Figure 2:
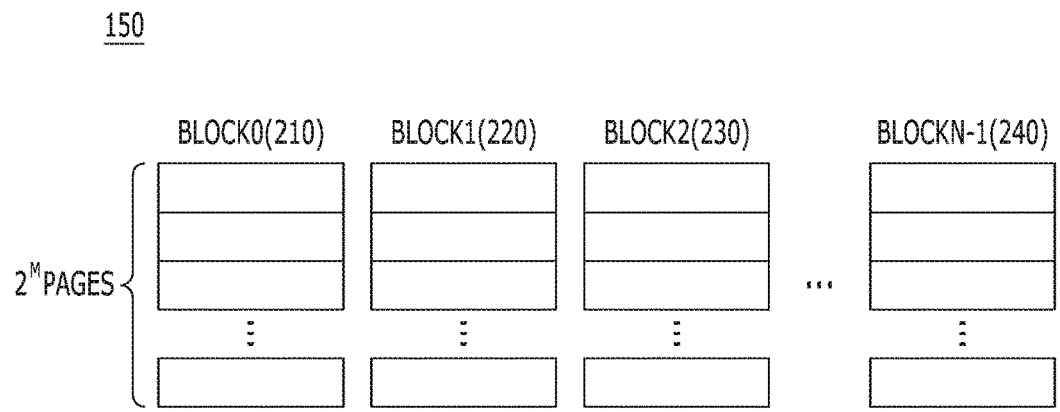
FIG. 2 is a schematic diagram illustrating an exemplary configuration of a memory device employed in the memory system shown in FIG. 1.

FIG. 2 is a schematic diagram illustrating the memory device 150 of FIG. 1.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
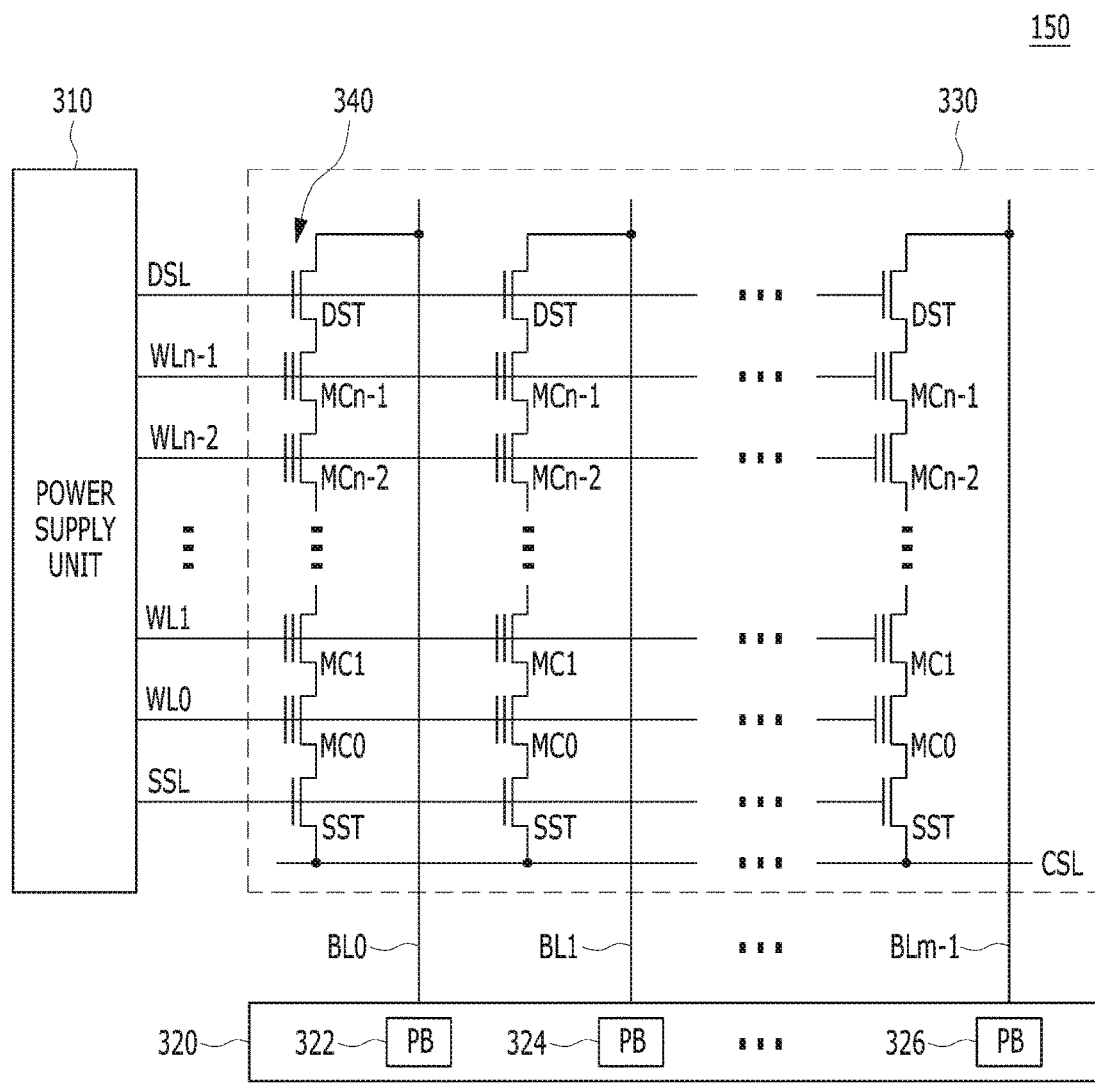
FIG. 3 is a circuit diagram illustrating an exemplary configuration of a memory cell array of a memory block in the memory device shown in FIG. 2.

FIG. 3 is a circuit diagram illustrating a memory block 330 in the memory device 150 of FIGS. 1 and 2.

Referring to FIG. 3, the memory block 330 may correspond to any of the plurality of memory blocks 152 to 156 shown in FIG. 1.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, the memory block 330 which is configured by NAND flash memory cells, it is to be noted that the memory block 330 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply unit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply unit 310 may perform a voltage generating operation under the control of a control circuit (not shown). The power supply unit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
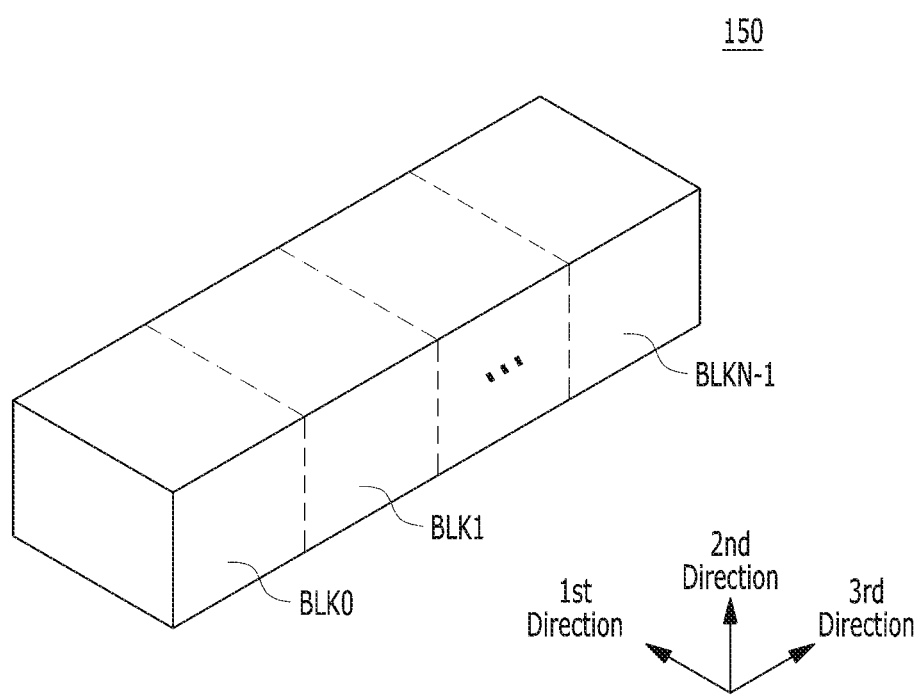
FIG. 4 is a schematic diagram illustrating an exemplary three-dimensional structure of the memory device shown in FIG. 2.

FIG. 4 is a schematic diagram illustrating a three-dimensional (3D) structure of the memory device 150 of FIGS. 1 and 2.

The memory device 150 may be embodied by a two-dimensional (2D) or a three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

The controller 130 may perform a pump-on operation on the memory device 150 in advance before reading data. The pump-on operation is a pre-charge operation, which means an operation to charge an electric charge by applying a predetermined voltage to a word line and a bit line of a cell selected in a cell array of the memory device 150. The controller 130 may read data requested by the host 102 to be read after the pump-on operation. The pump-on operation may consume tens of microseconds μs of time.

Generally, the controller 130 may read map data stored in a map table so as to read out a physical address, which corresponds to the data requested by the host 102. Such a map data read operation may be a background operation. The map data may be stored in a cache memory as well as stored in the memory 144. Consequently, as the controller 130 reads the map data, the physical address corresponding to the data may be read out.

According to a prior art, only when the physical address is read through the operation of reading the map data and transferring it to the host, the controller performs the pump-on operation and reads the data corresponding to the read physical address stored in the memory device. In other words, the pump-on operation may be performed after the physical address is read out. However, the physical address may not be required for the pump-on operation. Therefore, the system may consume unnecessary time to read out the physical address for the pump-on operation, which may deteriorate read performance of the controller.

According to embodiments of the present invention, the controller 130 may perform the pump-on operation during the physical address read-out operation, which is the background operation. Hereinafter, the pump-on operation that is performed during the background operation for reading out the physical address is defined as a "pre-pumping operation".

Hereinafter, the controller 130 will be described in detail with reference to FIGS. 5 to 7.

Figure 5:
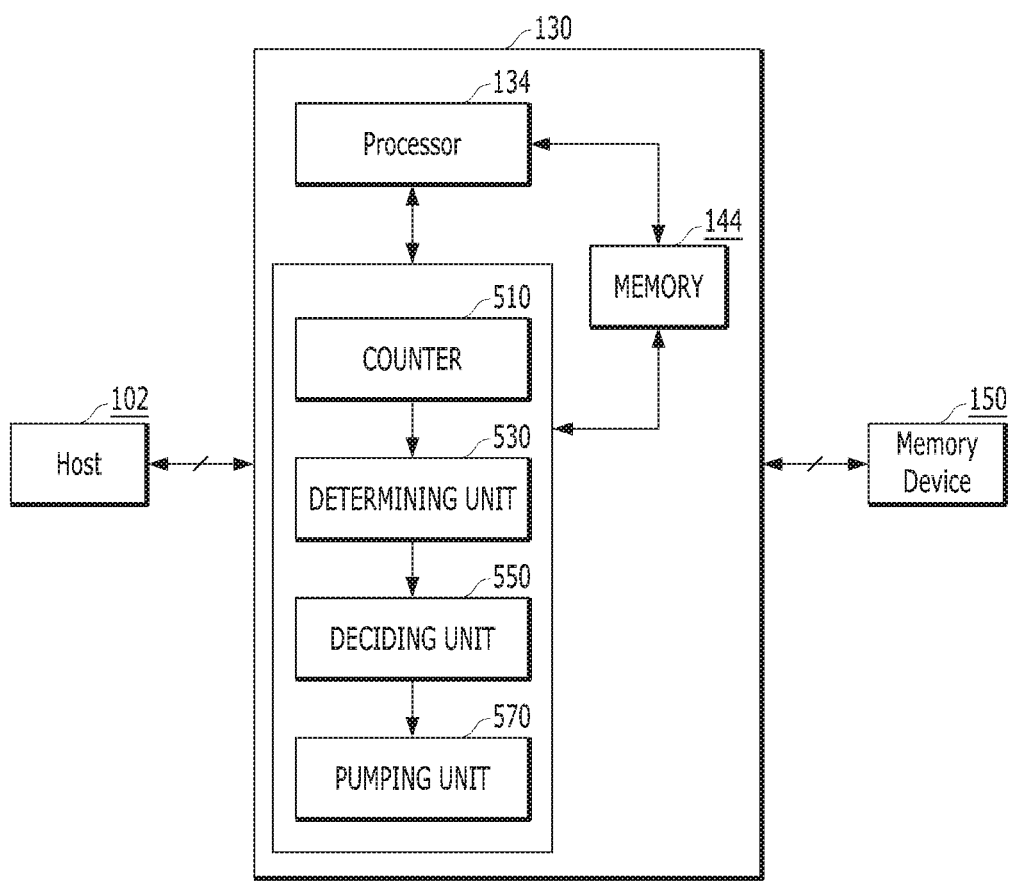
FIG. 5 is a schematic diagram illustrating a structure of a controller in accordance with an embodiment of the present invention.

FIG. 5 is a schematic diagram illustrating a structure of the controller 130 in accordance with an embodiment of the present invention.

The controller 130 may include a processor 134, a counter 510, a determining unit 530, a deciding unit 550, and a pumping unit 570.

Referring to FIG. 5, the processor 134 may control the memory device 150 to read out the physical address corresponding to the data requested by the host 102 by reading the map data stored in the memory 144. In addition, the processor 134 may control the memory device 150 to read the data corresponding to the physical address after the background operation to read out the physical address, which is the operation to read out the physical address by reading the map data, is completed.

The counter 510 may evaluate reliability of the map data based on reliability information on the map data stored in the memory 144 in order to determine whether or not the pre-pumping operation of the memory device 150 is performed. The reliability information on the map data may include a number of map misses and a number of map lookups. The number of map misses may be the number of times the memory device 150 has failed to read out the physical address. The number of map lookups may be the number of times the memory device 150 has succeeded in reading out the physical address. For example, when the physical address is not yet read out because the background operation is not completed, the counter 510 may count the number of map lookups and the number of map misses so as to evaluate the reliability of the map data. When the reliability of the map data is poor, the ratio of the number of map misses to the number of map lookups may be increased. Consequently, since time to perform the background operation may increase, the controller 130 may need to perform a control to perform the pre-pumping operation. On the other hand, when the reliability of the map data is good, the ratio of the number of map misses to the number of map lookups may be reduced. In other words, the processor 134 may not repeatedly read the map data, and the controller 130 may control the memory device 150 to perform the pump-on operation after the background operation for reading out the physical address is completed.

The determining unit 530 may determine whether or not the memory device 150 performs the pre-pumping operation based on the reliability information on the map data evaluated by the counter 510. When the reliability information on the map data is poor, the determining unit 530 may activate a pre-pumping mode so that the memory device 150 may perform the pre-pumping operation during the background operation. On the other hand, when the reliability information on the map data is good, the determining unit 530 may not activate the pre-pumping mode so that the memory device 150 may perform the pump-on operation after the background operation is completed. For example, when the ratio of the number of map misses to the number of map lookups is greater than a predetermined threshold value, the determining unit 530 may activate the pre-pumping mode. On the other hand, when the ratio of the number of map misses to the number of map lookups is equal to or smaller than the predetermined threshold value, the determining unit 530 may not activate the pre-pumping mode.

When the pre-pumping mode is activated, the deciding unit 550 may decide a target die on which the pre-pumping operation is performed. According to an embodiment, the deciding unit 550 may select as the target die at least one die among all dies in an idle state. For example, the idle dies may include a die most recently selected for a read operation, a die logically subsequent to the die most recently selected for a read operation, a die in the same channel as most recently selected for a read operation, a die in a channel logically subsequent to the channel most recently selected for a read operation, a die in the same way as most recently selected for a read operation, a die in a way logically subsequent to the way most recently selected for a read operation and a die previously selected for a read operation a great number of times. According to an embodiment, the deciding unit 550 may select a die based on the number of selection for the read operation by types of read requested data such as map data, meta data, user data, etc.

When the pre-pumping mode is not activated, since the pump-on operation is performed after the background operation to read out the physical address is completed, the deciding unit 550 may decide a die corresponding to the read-out physical address as a target die of the pump-on operation.

The pumping unit 570 may control the memory device 150 to perform the pre-pumping operation to the target die in the pre-pumping mode. For example, while the controller 130 is performing the background operation of obtaining the physical address, the pre-pumping operation may be performed. When the pre-pumping mode is not activated, the pumping unit 570 may control the memory device 150 to perform the pump-on operation after the background operation is completed.

Figure 6:
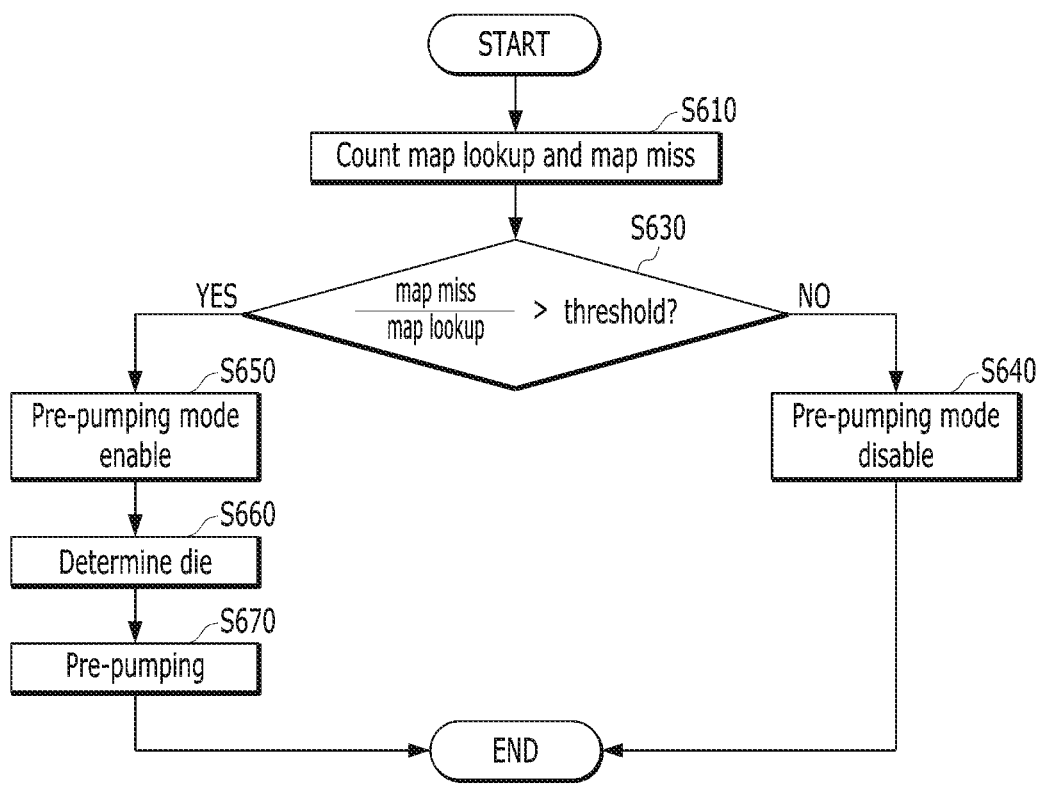
FIG. 6 is a flow chart illustrating an operation of a controller in accordance with an embodiment of the present invention.

FIG. 6 is a flow chart illustrating an operation of the controller 130 in accordance with an embodiment of the present invention.

At step S610, the counter 510 may obtain the reliability information on the map data. In other words, the counter 510 may count the number of map lookups and the number of map misses to obtain the reliability information on the map data.

At step S630, the determining unit 530 may determine whether or not to activate the pre-pumping mode and perform the pre-pumping operation by evaluating the reliability of the map data. When the reliability of the map data is poor, in other words, the ratio of the number of map misses to the number of map lookups is greater than the threshold value (that is, "YES" at step S630), the map misses may be determined to repeatedly occur and it may take too much time to read out the physical address. Therefore, the determining unit 530 may activate the pre-pumping mode at step S650. At step S660, the deciding unit 550 may determine the target die as described above. Then, at step S670, the pumping unit 570 may control the memory device 150 to perform the pre-pumping operation on the target die during the operation to read the map data stored in the map table (i.e., the background operation to read out the physical address).

As the time required for the background operation to read out the physical address increases, read performance of the controller 130 may decrease. In accordance with an embodiment of the present invention, when the map misses is determined to repeatedly occur as a result of the evaluation, the pre-pumping operation may be performed even before the physical address is read out thereby reducing the time required for the data read operation. As a result, the read performance of the controller 130 may be improved.

On the other hand, when the reliability of the map data is good, in other words, the ratio of the number of map misses to the number of map lookups is equal to or smaller than the threshold value (that is, "NO" at step S630), the map misses may be determined not to repeatedly occur and it may be possible to read out the physical address at rapid rate. That is, it may not take much time to read out the physical address. Therefore, at step S640, the determining unit 530 may determine not to perform the pre-pumping operation during the background operation to read out the physical address but to perform the pump-on operation and may deactivate the pre-pumping mode. The controller 130 may perform the pump-on operation after obtaining the physical address. The deciding unit 550 may decide the die corresponding to the read-out physical address as the target die on which the pump-on operation is performed, and the pumping unit 570 may control the memory device 150 to perform the pump-on operation on the decided target die.

Figure 7:
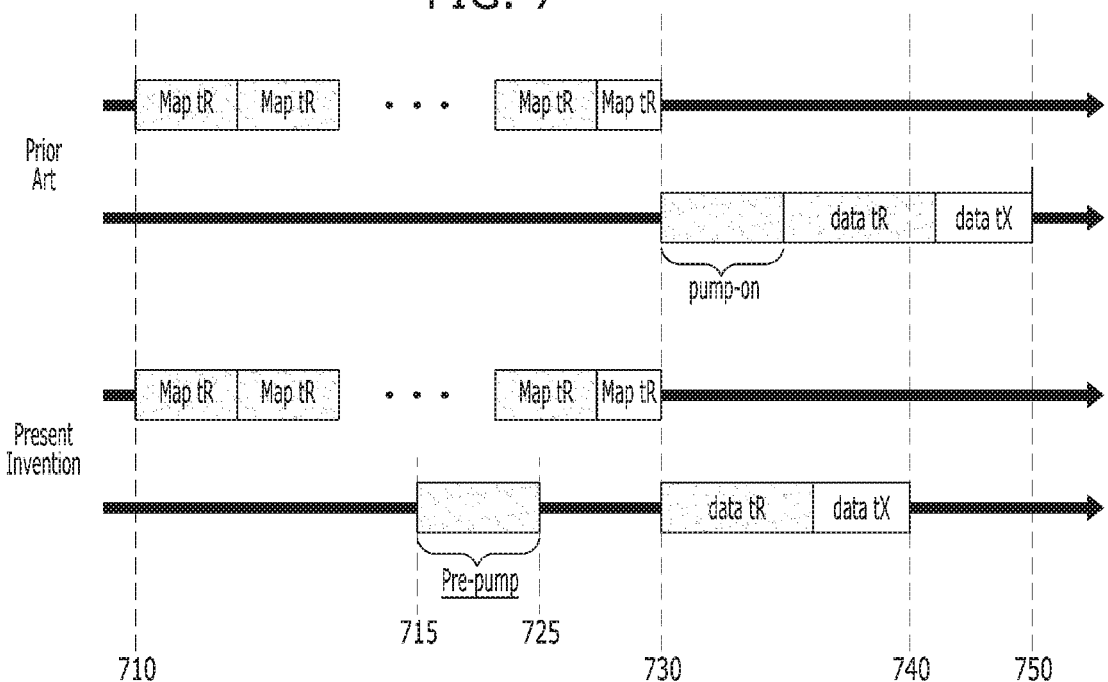
FIG. 7 is a diagram illustrating a comparison between an operation of a controller according to a prior art and an operation of a controller according to an embodiment of the present invention, based on the flow of time.

FIG. 7 is a diagram illustrating a comparison between an operation of the controller according to a prior art and an operation of the controller 130 according to an embodiment of the present invention, based on the flow of time, when the reliability of the map data is poor, in other words, the ratio of the number of map misses to the number of map lookups is greater than the threshold value. Hereinafter, it is assumed that the controller according to a prior art and the controller 130 according to an embodiment of the present invention read the same data and the number of map lookups and the number of map misses are the same.

The read operation may include a background operation of reading map data (i.e., a physical address of requested data), the pump-on operation, a read operation of reading data corresponding to the map data, and an operation of transmitting the read data to the host 102.

According to a prior art shown in FIG. 7, the controller may read map data Map tR stored in a map table in order to read out a physical address corresponding to requested data. When a map miss occurs, the controller may read the map data again. When the map miss repeatedly occurs, the controller may repeatedly read the map data Map tR. Referring to FIG. 7, the controller may repeatedly read the map data Map tR from a moment 710 to a moment 730. The controller may read out the physical address through the series of operations of reading the map data Map tR. Such background operation to read out the physical address may be performed from the moment 710 to a moment 730. After the background operation has been completed, the controller may control the memory device to perform the pump-on operation (denoted as "pump-on" in FIG. 7) from the moment 730 after the completion of the background operation so as to read the corresponding data data tR. After the pump-on operation is performed, the controller may read the corresponding data. The controller may transmit the read data data tX to the host. In conclusion, according to the prior art, total time to read the corresponding data may range from the moment 710 to a moment 750.

According to an embodiment of the present invention shown in FIG. 7, the controller 130 may read out the physical address of corresponding data through the background operations ("Map tR"), which are performed from a moment 710 to a moment 730. The controller 130 may activate the pre-pumping mode based on a determination of step S630. Therefore, the controller 130 may control the memory device 150 to perform the pre-pumping operation during the background operations. To be specific, the controller 130 may control the memory device 150 to perform the pre-pumping operation for a requested data before the physical address corresponding to the requested data is read out (i.e., before the moment 730). For example, the controller 130 may control the memory device 150 to perform the pre-pumping operation from a moment 715 to a moment 725. Although in FIG. 7 the pre-pumping operation is completed at the moment 725, this is merely an example and the present disclosure is not limited thereto. That is, in an embodiment, the pump-on operation may start before the read-out of the physical address is completed and the pre-pumping operation may be completed after the read-out of the physical address is completed. The controller 130 may read requested data corresponding to the physical address after the operation of reading out the physical address of the requested data and the pre-pumping operation are completed. Therefore, referring to FIG. 7, the controller 130 may read the requested data after the moment 730. Subsequently, the controller 130 may transmit the read data data tX to the host 102. In conclusion, when the controller 130 activates the pre-pumping mode, total time to read the corresponding data may range from the moment 710 to a moment 740.

As described above, there may be a difference of the moment 740 to the moment 750 between the total read time (i.e., from the moment 710 to the moment 750) of the controller according to the prior art and the total read time (i.e., from the moment 710 to the moment 740) of the controller 130 which activates the pre-pumping mode according to the embodiment of the present invention. The difference of the moment 740 to the moment 750 may correspond to the time from the moment 715 to the moment 725, which is the time required for the pre-pumping operation. In general, the maximum time required for the pump-on operation may be tens of microseconds μs. The read time of the controller 130 which activates the pre-pumping mode in accordance with the embodiment of the present invention may be faster by tens of microseconds than the read time of the controller according to the prior art, and this may reduce the total read time. Consequently, the read performance of the controller 130 may be improved.

FIGS. 8 to 16 are diagrams schematically illustrating application examples of the data processing system of FIGS. 1 to 7 according to various embodiments.

Figure 8:
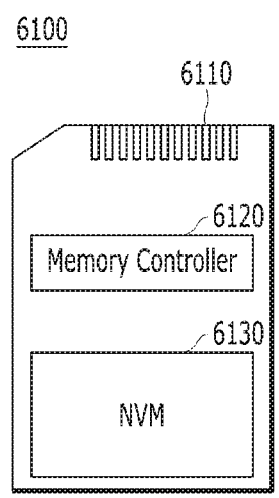
FIGS. 8 to 16 are diagrams schematically illustrating application examples of a data processing system, in accordance with various embodiments of the present invention.

FIG. 8 is a diagram schematically illustrating an example of the data processing system including the memory system in accordance with the present embodiment. FIG. 8 schematically illustrates a memory card system to which the memory system in accordance with the present embodiment is applied.

Referring to FIG. 8, the memory card system 6100 may include a memory controller 6120, a memory device 6130, and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 7, and the memory device 6130 may correspond to the memory device 150 of the memory system 110 described with reference to FIGS. 1 to 7.

Thus, the memory controller 6120 may include a RAM, a processing unit, a host interface, a memory interface and an error correction unit. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 9:
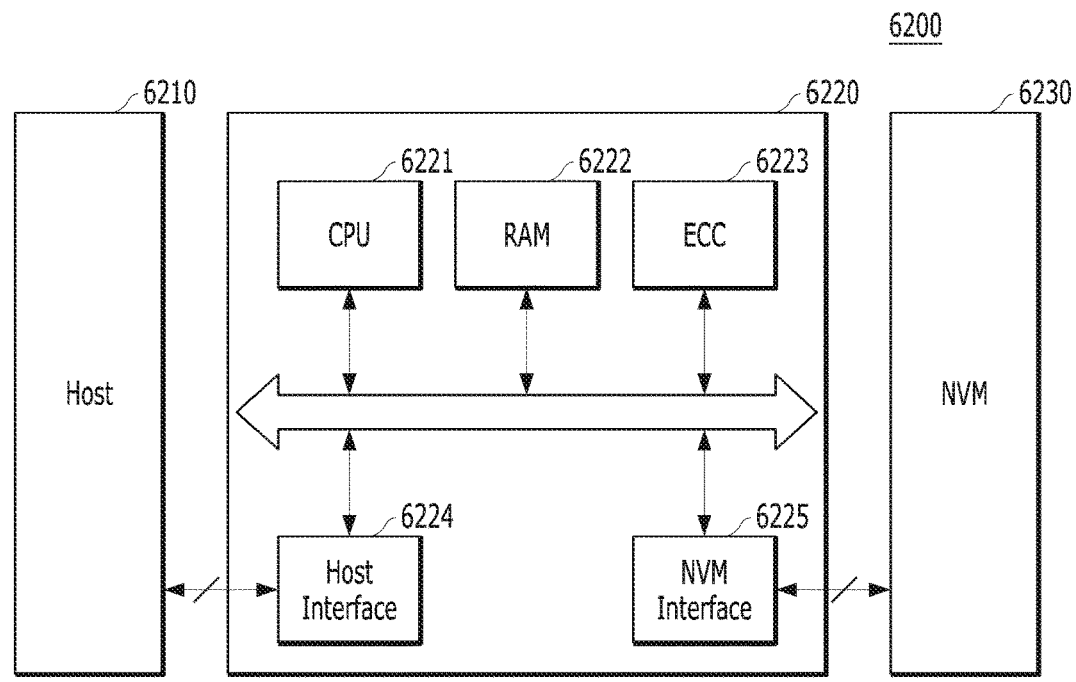

FIG. 9 is a diagram schematically illustrating an example of the data processing system including a memory system, in accordance with the present embodiment.

Referring to FIG. 9, the data processing system 6200 may include a memory device 6230 having one or more nonvolatile memories and a memory controller 6220 for controlling the memory device 6230. The data processing system 6200 illustrated in FIG. 9 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 7, and the memory controller 6220 may correspond to the controller 130 in the memory system 110 described in FIGS. 1 to 7.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NIM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 10:
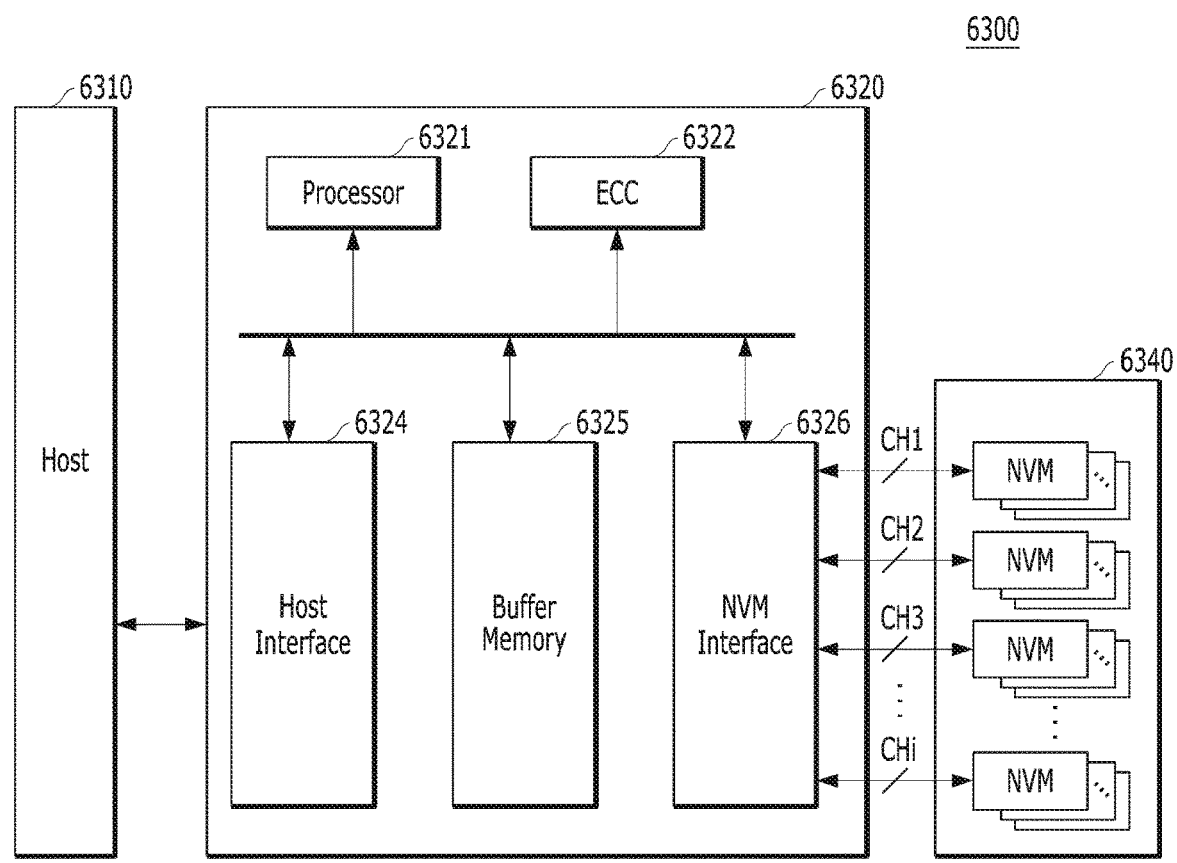

FIG. 10 is a diagram schematically illustrating an example of the data processing system including the memory system in accordance with the present embodiment. FIG. 10 schematically illustrates an SSD to which the memory system in accordance with the present embodiment is applied.

Referring to FIG. 10, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
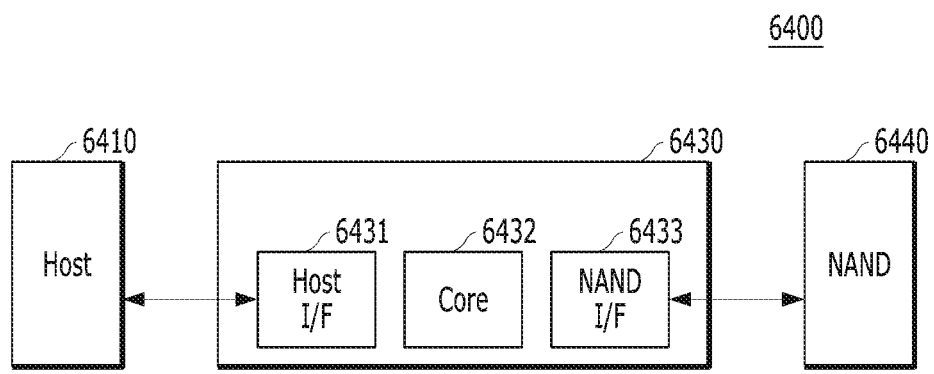

FIG. 11 is a diagram schematically illustrating an example of the data processing system including the memory system in accordance with an embodiment. FIG. 11 schematically illustrates an embedded Multi-Media Card (eMMC) to which the memory system in accordance with an embodiment is applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 12 to 15 are diagrams schematically illustrating other examples of the data processing system including the memory system in accordance with an embodiment. FIGS. 12 to 15 schematically illustrate UFS (Universal Flash Storage) systems to which the memory system in accordance with an embodiment is applied.

Referring to FIGS. 12 to 15, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 9 to 11, and the UFS cards 6530, 6630, 6730 and 6830 may be embodied in the form of the memory card system 6100 described with reference to FIG. 8.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 12:
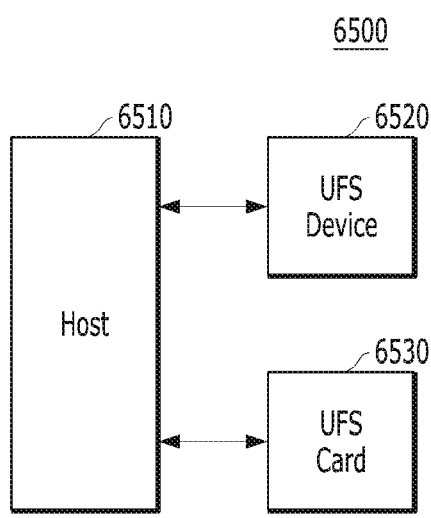

In the UFS system 6500 illustrated in FIG. 12, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 13:
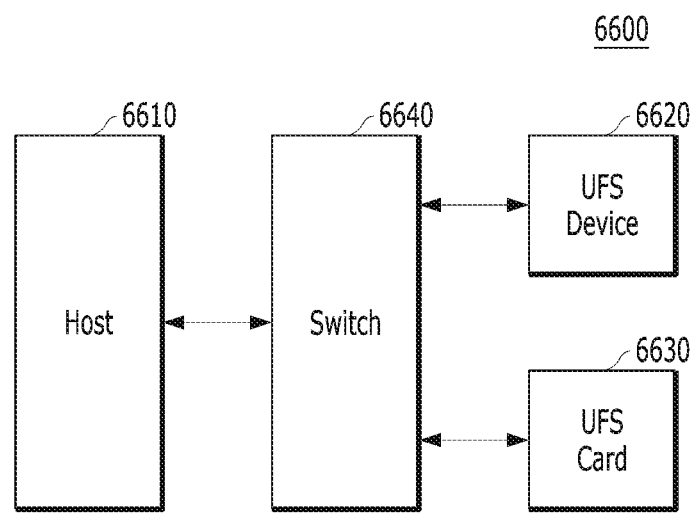

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
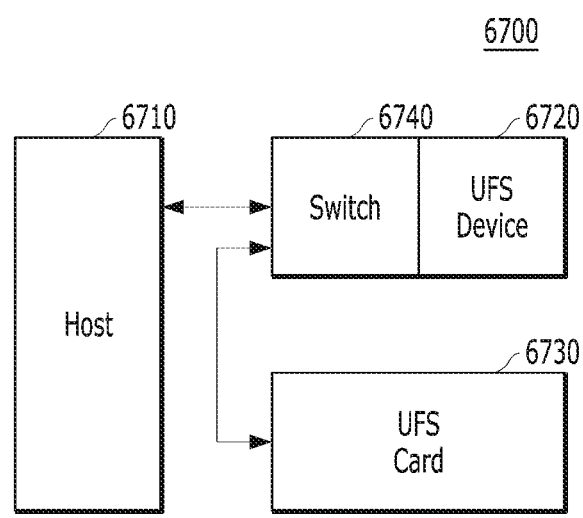

In the UFS system 6700 illustrated in FIG. 14, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
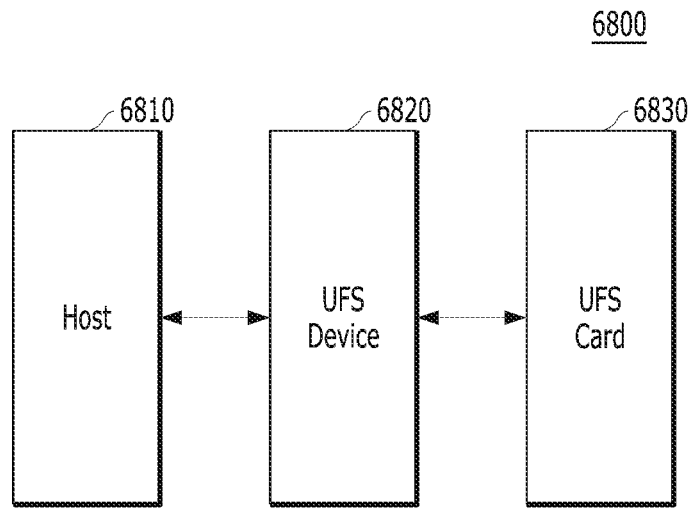

In the UFS system 6800 illustrated in FIG. 15, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
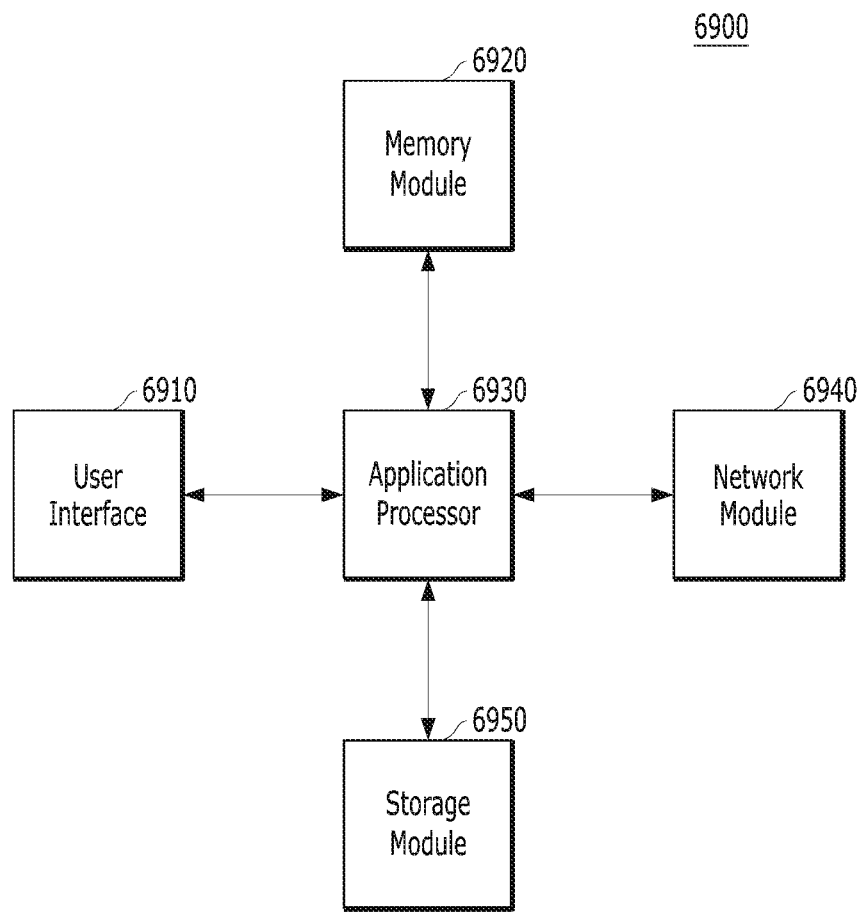

FIG. 16 is a diagram schematically illustrating another example of the data processing system including the memory system in accordance with an embodiment. FIG. 16 is a diagram schematically illustrating a user system to which the memory system in accordance with an embodiment is applied.

Referring to FIG. 16, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as defined in the following claims.

What is claimed is:

1. A controller, comprising:
a processor suitable for controlling a memory device to read map data stored in a memory and read out a physical address corresponding to data requested by a host;
a counter suitable for obtaining reliability information on the map data based on a number of map lookups and a number of map misses and evaluating reliability of the map data based on reliability information on the map data stored in the memory;
a determining unit suitable for activating a pre-pumping mode when the reliability of the map data is poor;
a deciding unit suitable for determining at least one idle die as a first target die among all idle dies on which to perform a pre-pumping operation for reading the data in the activated pre-pumping mode; and
a pumping unit suitable for controlling the memory device to perform the pre-pumping operation on the first target die during a background operation for reading out the physical address.

2. The controller of claim 1,
wherein the determining unit deactivates the pre-pumping mode when the reliability of the map data is good,
wherein the deciding unit further decides a second target die on which to perform a pump-on operation for reading the data in the deactivated pre-pumping mode, and
wherein the pumping unit controls the memory device to perform the pump-on operation on the second target die after the background operation for reading out the physical address is completed.

3. The controller of claim 2,
wherein the reliability information on the map data includes a ratio of the number of map misses to the number of map lookups, and
wherein the reliability of the map data is determined as good when the ratio of the number of map misses to the number of map lookups is equal to or smaller than a threshold value.

4. The controller of claim 2, the processor is further suitable for controlling the memory device to read the data corresponding to the physical address after the physical address is read out and the pump-on operation is performed.

5. The controller of claim 2, wherein the deciding unit decides a die corresponding to the read-out physical address as the second target die.

6. The controller of claim 1, wherein the memory device performs the background operation of reading out the physical address through the map data.

7. The controller of claim 1,
wherein the reliability information on the map data includes a ratio of the number of map misses to the number of map lookups, and
wherein the reliability of the map data is determined as poor when the ratio of the number of map misses to the number of map lookups is greater than a threshold value.

8. The controller of claim 1, wherein the processor controls the memory device to read the data corresponding to the physical address after the background operation for reading out the physical address is completed.

9. The controller of claim 1, wherein the idle die is one of a die most recently selected for a read operation, a die logically subsequent to the die most recently selected for a read operation, a die in the same channel as most recently selected for a read operation, a die in a channel logically subsequent to the channel most recently selected for a read operation, a die in the same way as most recently selected for a read operation, a die in a way logically subsequent to the way most recently selected for a read operation, and a die previously selected for a read operation a great number of times.

10. An operating method of a controller, comprising:
controlling a memory device to read map data stored in a memory and read out a physical address corresponding to data requested by a host;
calculating reliability information on the map data based on a number of map lookups and a number of map misses;
evaluating reliability based on reliability information on the map data stored in the memory;
activating a pre-pumping mode when the reliability of the map data is poor;
determining at least one idle die as a first target die among all idle dies on which to perform a pre-pumping operation for reading the data in the activated pre-pumping mode; and
controlling the memory device to perform the pre-pumping operation on the first target die during a background operation for reading out the physical address.

11. The operating method of claim 10,
wherein the pre-pumping mode is deactivated when the reliability of the map data is good,
further comprising:
deciding a second target die on which to perform a pump-on operation for reading the data is decided in the deactivated pre-pumping mode; and
controlling the memory device to perform the pump-on operation on the second target die after the background operation for reading out the physical address is completed.

12. The operating method of claim 11,
wherein the reliability information on the map data includes a ratio of the number of map misses to the number of map lookups, and
wherein the reliability of the map data is determined as good when the ratio of the number of map misses to the number of map lookups is equal to or smaller than a threshold value.

13. The operating method of claim 11, further comprising controlling the memory device to read data corresponding to the physical address after the physical address is read out and the pump-on operation is performed.

14. The operating method of claim 11, wherein the deciding of the second target includes determining a die corresponding to the read-out physical address as the second target die.

15. The operating method of claim 10, wherein the background operation of reading out the physical address is performed through the map data.

16. The operating method of claim 10,
wherein the reliability information on the map data includes a ratio of the number of map misses to the number of map lookups, and
wherein the reliability of the map data is determined as poor when the ratio of the number of map misses to the number of map lookups is greater than a threshold value.

17. The operating method of claim 10, further comprising controlling the memory device to read data corresponding to the physical address after the physical address is read out.

18. The operating method of claim 10, wherein the idle die is one of a die most recently selected for a read operation, a die logically subsequent to the die most recently selected for a read operation, a die in the same channel as most recently selected for a read operation, a die in a channel logically subsequent to the channel most recently selected for a read operation, a die in the same way as most recently selected for a read operation, a die in a way logically subsequent to the way most recently selected for a read operation and a die previously selected for a read operation a great number of times.

19. A memory system comprising:
a memory device; and
a controller suitable for controlling the memory device to read requested data based on map data, and suitable for controlling, when a reliability of the map data is below a threshold, the memory device to perform a pre-pump operation for reading the requested data while reading the map data.

* * * * *